(12) United States Patent
Wu

(10) Patent No.: US 7,025,288 B2
(45) Date of Patent: Apr. 11, 2006

(54) EDGE REMOVER HAVING A GAS SPRAYER TO PREVENT A CHEMICAL SOLVENT FROM SPLASHING

(75) Inventor: Chao-Min Wu, Miao Li (TW)

(73) Assignee: Au Optronics Corp., Hsinchu (TW)

( * ) Notice: Subject to any disclaimer, the term of this patent is extended or adjusted under 35 U.S.C. 154(b) by 424 days.

(21) Appl. No.: 10/421,896

(22) Filed: Apr. 24, 2003

(65) Prior Publication Data

US 2004/0195365 A1 Oct. 7, 2004

(30) Foreign Application Priority Data

Mar. 11, 2003 (TW) .............................. 92105249 A

(51) Int. Cl.
*B05B 1/28* (2006.01)
*B05B 9/00* (2006.01)
*B05B 1/34* (2006.01)
*B05B 15/08* (2006.01)

(52) U.S. Cl. ...................... 239/290; 239/124; 239/380; 239/451; 239/587.1

(58) Field of Classification Search ................ 239/290, 239/124, 380, 389, 451, 455, 456, 587.1
See application file for complete search history.

(56) References Cited

U.S. PATENT DOCUMENTS

| | | | |
|---|---|---|---|
| 5,552,177 A * | 9/1996 | Jacobs et al. | 427/2.29 |
| 5,745,946 A * | 5/1998 | Thrasher et al. | 15/77 |
| 5,939,139 A * | 8/1999 | Fujimoto | 427/240 |
| 6,352,623 B1 * | 3/2002 | Volodarsky et al. | 204/275.1 |
| 6,375,741 B1 * | 4/2002 | Reardon et al. | 118/313 |

\* cited by examiner

*Primary Examiner*—Davis Hwu

(57) ABSTRACT

A gas sprayer mounted on an edge removing robotic arm is disclosed, wherein the edge removing robotic arm circles around along the edges of a substrate and sprays a chemical solvent over the edge surface of the substrate to dissolve photoresist materials attached to the edges of the substrate; the edge removing robotic arm has a pumping conduit for sucking out the chemical solvent sprayed over the surface of the substrate and dissolved photoresist particles; the gas sprayer is mounted on the top of the edge removing robotic arm and comprises a hooked nozzle extending forward around the front end of the edge removing robotic arm and facing an opening of the pumping conduit to spray gas out so as to prevent the chemical solvent sprayed out from the edge removing robotic arm from splashing onto the interior of the substrate.

5 Claims, 3 Drawing Sheets

EDGE REMOVER HAVING A GAS SPRAYER TO PREVENT A CHEMICAL SOLVENT FROM SPLASHING

FIELD OF THE INVENTION

The present invention relates to an edge remover (ER) for removing photoresists on the edge surfaces of a substrate and, more specifically, to a gas sprayer mounted on an edge remover to prevent chemical solvents from splashing in an edge removing procedure.

BACKGROUND OF THE INVENTION

With rapid advancement of the fabrication technology of a thin film transistor liquid crystal display (TFT-LCD), the LCD is largely applied in various electronic products such as a Personal Digital Assistant (PDA) device, a notebook computer, a digital camera, a video camera, and a mobile phone due to the fact it has advantages of smaller size, less weight, lower power consumption and low radiation. Moreover, the quality of the LCD is ceaselessly improved and the price thereof is continuously decreased since manufacturers aggressively invest in research & development and employ large-scale fabricating equipment. That promptly broadens the applied fields of the LCD.

In the fabrication of the TFTs or related circuits, thin film deposition and photolithography processes are repeatedly performed on a substrate to define corresponding devices and circuit patterns. A variety of insulating films or conducting layers are formed on the substrate by chemical vapor deposition (CVD) or physical vapor deposition (PVD) procedures, and the desired devices are fabricated or the related circuits are defined by photolithography processes to pattern various types of thin films into a desired shape. In a typical photolithography process, a photoresist is first coated on a substrate. An exposure procedure is then performed using a photo mask having a certain pattern to have the photoresist film on the substrate selectively sensitized such that the pattern of the photo mask can be completely transferred onto the photoresist film. Thereafter, the photoresist film is developed. Based on the characteristics of the material used for the photoresist, the exposed portion or the unexposed portion of the photoresist film is selectively removed to form a resist pattern. Afterwards, the underlying film is selectively etched using the resist pattern as an etch mask to pattern the film. Hence, the related device is fabricated.

A spin coating procedure is typically used to coat a photoresist film. When the liquid of photoresist is sprayed onto the substrate, the substrate is simultaneously rotated so that the photoresist film coated on the substrate can be formed more uniformly. However, during such a spin coating, the photoresist liquid would flow to the edges of the substrate due to the centrifugal force produced by rotation of the substrate and then, the photoresist materials attach to the edges, sidewalls and even the bottom surface of the substrate. When a robotic arm or a carrying base in the subsequent processes are contacted with the substrate, the attached photoresist materials might peel off to cause serious particle pollution.

To solve this problem, an edge removing procedure is performed after the photoresist film is coated so that the photoresist materials attached to the edges, sidewalls and the bottom surface of the substrate can be removed. During edge removing, referring to FIG. 1, edge removing arms 10 extended from an edge remover are distributed at the four corners of a substrate 12 and go around clockwise or counterclockwise along the edges of the substrate 12 so as to get rid of the photoresist materials attached to the edges of the substrate 12 and to keep the photoresist 14 at the interior of the substrate 12.

FIG. 2 is a schematic perspective diagram of the construction of the edge removing arm 10, which includes a flat plate 20 and a L-shape board 22. The flat plate 20 is combined to the L-shape board 22 to form a recess for receiving the edge of the substrate 12. An upper immovable arm 24 whose rear end is connected with a conduit 26 carrying a chemical solvent, is mounted on the top surface of the flat plate 20 to deliver the chemical solvent through a nozzle (not shown) at the bottom surface of the flat plate 20 to spray over the top surface of the substrate 12. A lower immovable arm 28 whose rear end is also connected with a conduit 30 carrying a chemical solvent, is mounted on the bottom surface of the L-shape board 22 to deliver the chemical solvent through nozzles at the top surface of the L-shape board 22 to spray over the bottom surface of the substrate 12. Moreover, a pedestal 32 is combined to the rear ends of the flat plate 20 and the L-shape board 22. A vacuum conduit 34 goes through the pedestal 32 and the L-shape board 22 in order to pump air from the recess through an opening at the wall of the upright portion of the L-shape board 22.

FIG. 3 is a partially schematic sectional view of the construction of the edge removing arm 10. As mentioned in the above, in the edge removing procedure, the edge of the substrate 12 is inserted to the recess constructed by the flat plate 20 and the L-shape board 22. After the vacuum conduit 34 is activated to pump air from the recess, the chemical solvents carried in the conduits 26 and 30 are respectively sprayed over the top and bottom surfaces of the substrate 12 respectively through the nozzles 36 and 38 so as to remove the photoresist materials attached to the edge of the substrate 12. The chemical solvents on the surface of the substrate 12 and the dissolved photoresist particles are simultaneously pumped out through the vacuum conduit 34 so as to prevent the chemical solvents from flowing into the other locations on the substrate 12 to erode the portion of the photoresists desired to remain on the substrate 12.

However, whenever the pump module of the vacuum conduit 34 cannot provide sufficient suction or has intermittent breakdowns, the chemical solvent sprayed out from the nozzle 36 of the flat plate 20 would splash onto the interior of the substrate 12, as shown by the dotted arrow in FIG. 3, to erode the portion of the photoresists desired to remain on the substrate 12. This causes the subsequent defined patterns not to be precise and reduces the yield of the entire process. Particularly, with shrink in the device size and increase in the integration, a slight error in patterns might lead to operation failure of a large number of devices. Therefore, under the requirement to maintaining the original design of the current edge remover, how to effectively solve the problem of solvent splashing during edge removing has become an important subject so as to further enhance the yield of product fabrication.

SUMMARY OF THE INVENTION

An objective of the present invention is to provide a gas sprayer mounted on a robotic arm of an edge remover to prevent chemical solvents sprayed out from the robotic arm from splashing onto the interior surface of a substrate.

Another objective of the present invention is to provide a novel design of a robotic arm of an edge remover to increase the yield of a photolithography process.

An edge remover capable of preventing chemical solvents from splashing onto the interior surface of a substrate is disclosed in this invention. The edge remover comprises a support pedestal for holding a substrate in the process of edge removing, an edge removing arm and a gas sprayer. The support pedestal holds the substrate from the central portion of the bottom surface of the substrate so as to facilitate cleaning off the photoresist materials attached onto the top and bottom surfaces of the edge of the substrate. The edge removing arm has an upper plate and a lower plate respectively protruding forward. An inward recess is constructed by both the upper plate and the lower plate for receiving the edge of the substrate to perform the edge removing procedure. A first nozzle is disposed at the bottom surface of the upper plate to spray a chemical solvent for cleaning the top surface of the edge of the substrate. A second nozzle is disposed at the top surface of the lower plate to spray a chemical solvent for cleaning the bottom surface of the edge of the substrate. The upright part of a wall of the edge removing arm defining the recess has an opening through which the chemical solvents and the dissolved photoresist materials at the substrate are pumped out. The gas sprayer mounted on the top of the edge removing arm has a hooked nozzle extending forward around the front end of the upper plate into the recess and facing the opening of the wall to spray gas out so as to prevent the chemical solvent sprayed out from the first nozzle at the bottom surface of the upper plate from splashing onto the interior of the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

This invention provides a gas sprayer mounted on an edge removing robotic arm. The edge removing robotic arm circles around along the edges of a substrate and sprays a chemical solvent over the edge surface of the substrate to dissolve the photoresist materials attached to the edges of the substrate. Moreover, the edge removing robotic arm has a pumping conduit for sucking out the chemical solvent sprayed over the surface of the substrate and the photoresist dissolution. The gas sprayer is mounted on the top of the edge removing robotic arm and has a hooked nozzle extending forward around the front end of the edge removing robotic arm. The hooked nozzle of the gas sprayer faces the opening of the pumping conduit to spray gas out so as to prevent the chemical solvent sprayed out from the edge removing robotic arm from splashing onto the interior of the substrate. The best mode of the present invention is illustrated below in detail.

When an edge removing procedure is performed, a substrate is placed on a support pedestal (not shown) of an edge remover. The support pedestal holds the substrate from the central portion of the bottom surface of the substrate so as to facilitate cleaning off the photoresist materials attached onto the top and bottom surfaces of the edge of the substrate. As mentioned in the above, since the photoresist film is coated on the substrate by the spin coating, a portion of the photoresist materials flow to the edge of the substrate due to the centrifugal force and even stick to the bottom surface of the substrate. In order to remove the photoresist materials from these locations, the current edge removing arm cleans both the top and bottom surfaces of the edge of the substrate simultaneously by spraying the chemical solvents.

Figure 1:
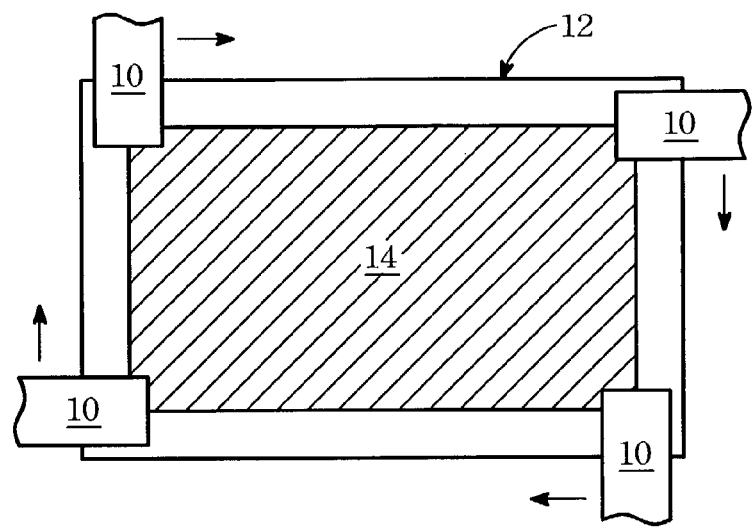
FIG. 1 is a schematic top view of a substrate in the process of edge removing in the prior art, wherein edge removing arms are distributed at the four corners of the substrate and go around along the edges of the substrate so as to get rid of the photoresist materials attached to the edges of the substrate.
Figure 2:
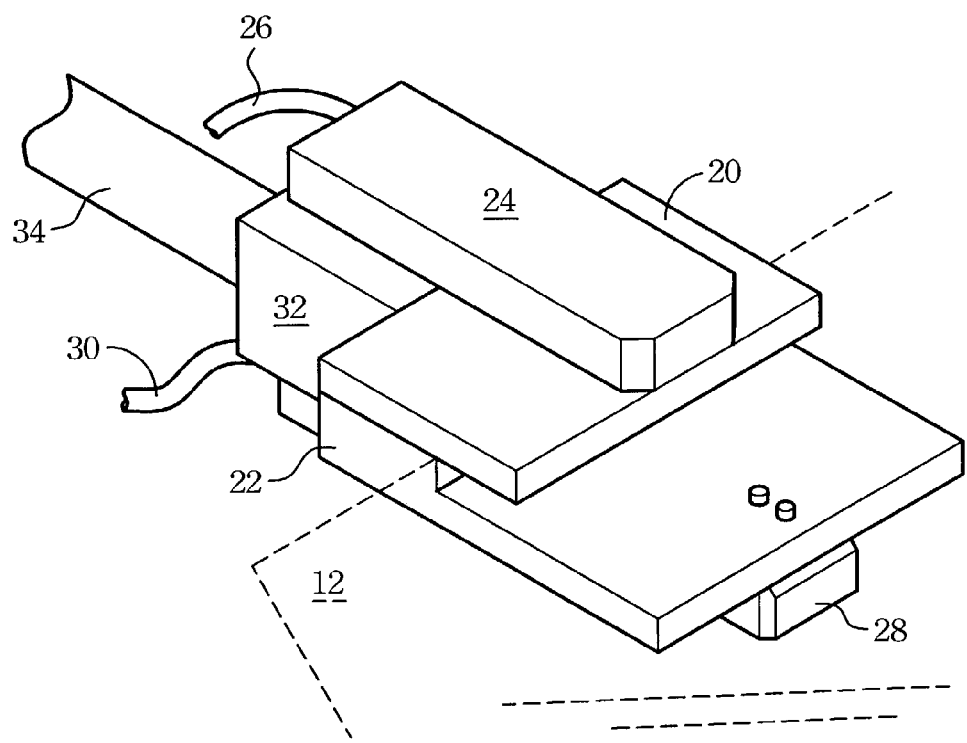
FIG. 2 is a schematic perspective diagram of the construction of the conventional edge removing arm.
Figure 3:
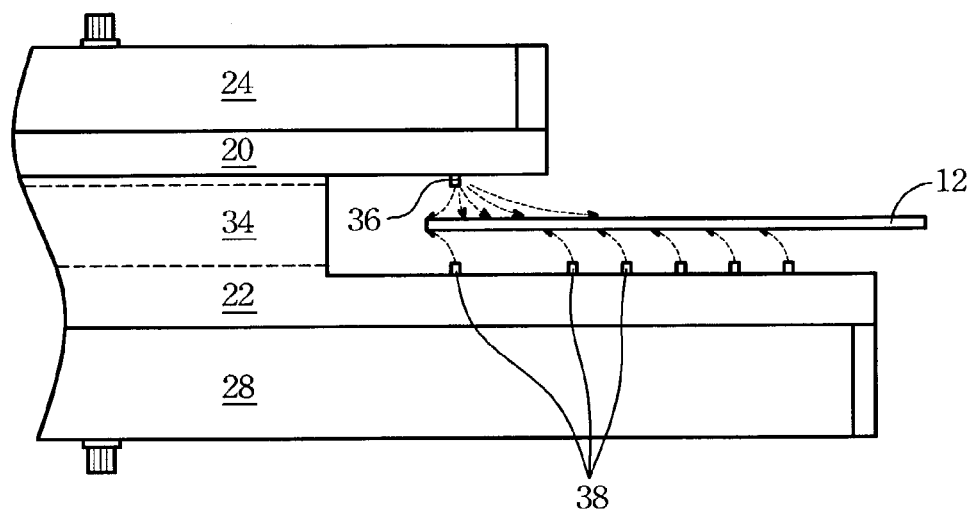
FIG. 3 is a partially schematic sectional view of the construction of the conventional edge removing arm, illustrating the conventional edge removing arm is cleaning the substrate.
Figure 4:
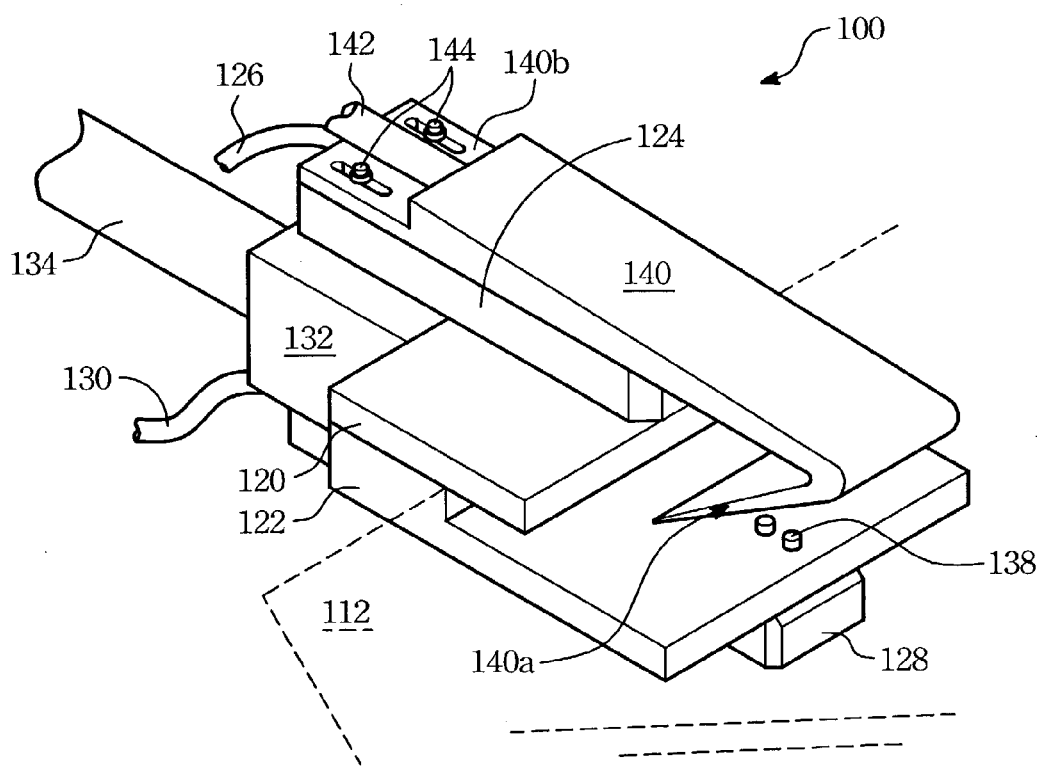
FIG. 4 shows a schematic perspective diagram of the construction of the edge removing arm in accordance with this invention.

Please refer to FIG. 4, illustrating the design of an edge removing robotic arm able to prevent chemical solvent from splashing onto the interior of the substrate in this invention. The edge removing robotic arm 100 includes a flat plate 120 and a L-shape board 122. The L-shape board 122 is combined to the flat plate 120. A nozzle (not shown) is disposed at the bottom surface of the front portion of the flat plate 120. As shown in FIG. 4, the top surface of the upright portion of the L-shape board 122 is directly jointed to the bottom surface of the rear portion of the flat plate 120 to form a "⌐"-shape recess for receiving the edge of a substrate 112 in the process of edge removing. The wall of the upright portion of the L-shape board 122 near the recess has an opening (not shown) through which the chemical solvents and the dissolved photoresist particles remained at the substrate 112 are pumped out. Furthermore, nozzles 138 are disposed on the top surface of the front portion of the L-shape board 122 for spraying a chemical solvent upward to clean off the photoresist materials attached to the bottom surface of the substrate 112.

An upper immovable arm 124 whose rear end is connected with a conduit 126 carrying a chemical solvent, is mounted on the top surface of the flat plate 120 to deliver the chemical solvent into the flat plate 120. The chemical solvent is sprayed over the top surface of the substrate 112 by the nozzle at the bottom surface of the flat plate 120. Similarly, a lower immovable arm 128 whose rear end is also connected with another conduit 130 carrying a chemical solvent, is mounted on the bottom surface of the L-shape board 122 to deliver the chemical solvent into the L-shape board 122. The chemical solvent is sprayed upward over the bottom surface of the substrate 112 by the nozzles 138 at the top surface of the front portion of the L-shape board 122.

A pedestal 132 is combined to the rear ends of the flat plate 120 and the L-shape board 122. The top and bottom surfaces of the pedestal 132 are respectively jointed with the upper and lower immovable arms 124, 128. A vacuum conduit 134 is connected to the rear end of the pedestal 132 and penetrates the pedestal 132 and the upright portion of the L-shape board 122 and is joined with the opening at the wall of the upright portion of the L-shape board 122 in order to pump out the chemical solvents and the dissolved photoresist particles remained at the substrate 112 by means of the sucking of a pump machine.

In this invention, a gas sprayer 140 is mounted on the top surface of the upper immovable arm 124 to effectively solve the splashing problem of the chemical solvent. The gas sprayer has a hooked nozzle 140a extending forward around the front ends of the upper immovable arm 124 and the flat plate 120 into the recess. The hooked nozzle 140a of the gas sprayer 140 faces the opening at the wall of the upright portion of the L-shape board 122 to spray gas out so as to prevent the chemical solvent sprayed out by the nozzle at the bottom surface of the flat plate 120 from splashing onto the interior of the substrate 112. As shown in FIG. 4, a thin plate 140b extending from the lower portion of the rear end of the gas sprayer 140 is fixed onto the top surface of the upper immovable arm 124 by screws 144. A gas conduit 142 connected to the rear end of the gas sprayer 140 can deliver a gas such as nitrogen through the hooked nozzle 140a to spray toward the recess.

Figure 5:
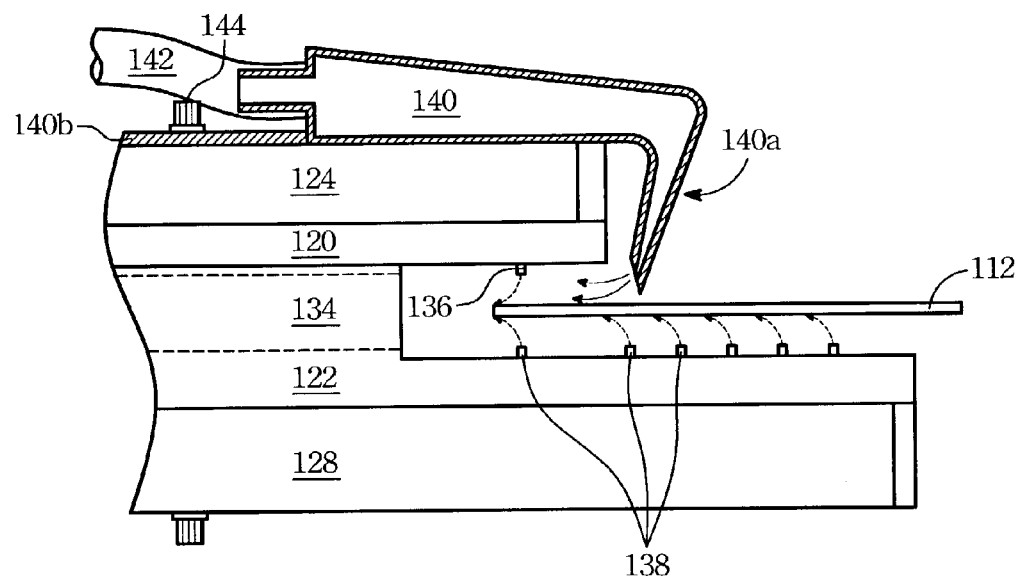
FIG. 5 shows is a partially schematic sectional view of the construction of the edge removing arm in accordance with this invention.

Referring to FIG. 5, which is a partially schematic sectional view of the construction of the edge removing arm 100, in the edge removing procedure, the edge of the substrate 112 is inserted to the recess constructed by the flat plate 120 and the L-shape board 122. After the vacuum conduit 134 is activated to pump air from the recess, the chemical solvents carried in the conduits 126 and 130 are respectively sprayed over the top and bottom surfaces of the substrate 112 respectively through the nozzles 136 and 138 so as to dissolve and remove the attached photoresist materials. The chemical solvents on the surface of the substrate 112 and the dissolved photoresist particles are simultaneously pumped out through the vacuum conduit 134 so as to prevent the chemical solvents from flowing into the interior surface of the substrate 112 to erode the portion of the photoresists desired to remain on the substrate 112.

Since the gas sprayer 140 mounted on the top surface of the upper immovable arm 124 sprays the gas toward the recess, the chemical solvent sprayed out from the nozzle 136 of the flat plate 120 can be blown to the edge of the substrate 112 rather than splashs onto the interior surface of the substrate 112, even if the vacuum conduit 134 cannot provide sufficient suction or has intermittent breakdowns.

Figure 6:
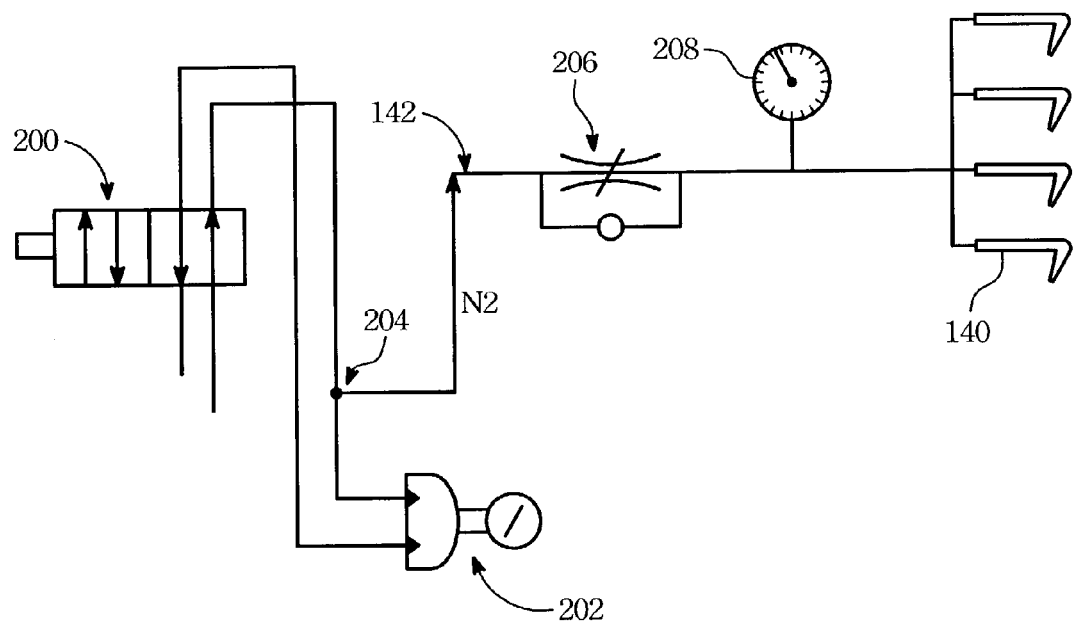
FIG. 6 is a pipeline layout design of a gas sprayer provided in this invention.

In the actual fabrication, it needs no complicated designs for the pipeline layout of the edge remover to take advantage of the gas sprayer provided in this invention. Only an appropriate modification to the pipeline of the original automatic valve is necessary. Referring to FIG. 6, in the original edge remover layout, a four way-dual position solenoid valve 200 is used as a switch for the vacuum conduit 134. When the solenoid valve 200 is switched to a right position, as shown in FIG. 6, the automatic valve 202 can be pushed and opened by the nitrogen gas flowing along the two pipe routes to start pumping.

In this invention, a three-way pipe 204 is installed on the original pipeline and a portion of the nitrogen gas can be delivered along the connected gas conduit 142 to the gas sprayer 140 having the hooked nozzle 140a. That is, once the nitrogen gas of the solenoid 200 flows to open the automatic valve 202, the vacuum conduit 134 starts to pump and simultaneously, the gas sprayer 140 also sprays out the nitrogen gas. Since four sets of edge removing arms are designed for the current edge remover to simultaneously clean the four edges of the substrate, four sets of hooked gas sprayers 140 are provided in FIG. 6 to be installed on each of the edge removing arms. Furthermore, a throttle valve 206 and a pressure gauge 208 can be installed on the gas conduit 142 to appropriately adjust the flow rate of the nitrogen gas in the gas conduit 142 such that a most suitable spray amount of the nitrogen gas for the process conditions can be found out to reduce the probability of chemical solvent erosion of the photoresists at the interior of the substrate.

Comparing with the prior art, the structure of the edge removing arm provided in this invention has the following advantages:

1. With the hooked gas sprayers of this invention, it can effectively prevent the chemical solvent from dropping in the interior of the substrate, and hence, the frequency of a re-coating photoresist process is reduced and manufacturing costs are largely reduced;
2. Since the chances for the chemical solvent to drop in the interior of the substrate are reduced, the probability of maintenance and adjustment to the edge remover is reduced and the utilization of the edge remover is raised and a normal throughput can be maintained; and
3. Since the design and the related pipeline layout provided in this invention need no expensive manufacturing costs, the fabrication yield of products is effectively increased without high additional costs.

As is understood by a person skilled in the art, the foregoing embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed:

1. A gas sprayer mounted on an edge removing robotic arm, said edge removing robotic arm circling around along the edges of a substrate, spraying a chemical solvent over the edge surface of said substrate to dissolve photoresist materials attached to the edges of said substrate, and having a pumping conduit for sucking out said chemical solvent sprayed over the surface of said substrate and dissolved photoresist particles; wherein said gas sprayer is mounted on the top of said edge removing robotic arm and comprises a hooked nozzle extending forward around the front end of said edge removing robotic arm and facing an opening of said pumping conduit to spray gas out so as to prevent said chemical solvent sprayed out from said edge removing robotic arm from splashing onto the interior of said substrate.

2. The gas sprayer of claim 1, wherein the front portion of said edge removing robotic arm has a "⊏"-shape recess for receiving the edge of said substrate to perform an edge removing procedure.

3. The gas sprayer of claim 2, wherein the upright part of a wall of said edge removing robotic arm defining said recess has said opening of said pumping conduit.

4. The gas sprayer of claim 2, wherein the upper and lower parts of a wall of said edge removing robotic arm defining said recess respectively have a nozzle spraying out said chemical solvent toward said substrate received in said recess.

5. The gas sprayer of claim 4, wherein said hooked nozzle sprays gas out toward said recess to prevent said chemical solvent sprayed out from said nozzle of the upper part of said wall from splashing onto the interior surface of said substrate.

* * * * *